(12) United States Patent
Bae

(10) Patent No.: US 9,564,895 B2
(45) Date of Patent: Feb. 7, 2017

(54) TOUCH KEY ASSEMBLY AND DISPLAY DEVICE INCLUDING THE TOUCH KEY ASSEMBLY

(71) Applicant: Samsung Display Co., Ltd., Yongin, Gyeonggi-do (KR)

(72) Inventor: Kyu-Han Bae, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 140 days.

(21) Appl. No.: 13/971,832

(22) Filed: Aug. 20, 2013

(65) Prior Publication Data

US 2014/0267948 A1  Sep. 18, 2014

(30) Foreign Application Priority Data

Mar. 14, 2013  (KR) .................. 10-2013-0027092

(51) Int. Cl.
  *H03K 17/96*  (2006.01)

(52) U.S. Cl.
  CPC ... *H03K 17/9631* (2013.01); *H03K 2017/9634* (2013.01); *H03K 2217/96015* (2013.01); *H03K 2217/96031* (2013.01); *H03K 2217/96079* (2013.01); *Y10T 29/49002* (2015.01)

(58) Field of Classification Search
  CPC ........ G06F 3/041; G06F 3/042; G06F 3/0412; G06F 2203/04103; G06F 2203/04109; G06F 3/02; G06F 3/0202; G06F 3/021; G06F 3/0227; G02F 1/13338; H04M 1/0266; H04M 1/0277; H04M 1/22; H04M 1/23; H04M 2250/22; H01H 2239/074; H01H 2219/062; H03K 17/96; H03K 17/9631; H03K 17/9638; H03K 17/9627; H03K 2017/9634; H03K 2217/96015; H03K 2217/96023; H03K 2217/96031; H03K 2217/9607; H03K 2217/960755; H03K 2217/96079; Y10T 29/49002
  See application file for complete search history.

(56) References Cited

U.S. PATENT DOCUMENTS

| | | | |
|---|---|---|---|
| 7,764,341 B2 | 7/2010 | Yu et al. | |
| 7,825,907 B2 | 11/2010 | Choo et al. | |
| 8,884,889 B2 | 11/2014 | Beom et al. | |
| 2004/0141110 A1* | 7/2004 | Yu .................. | G02F 1/13338 349/110 |

(Continued)

FOREIGN PATENT DOCUMENTS

| | | |
|---|---|---|
| CN | 1510486 A | 7/2004 |
| CN | 102467852 A | 5/2012 |

(Continued)

OTHER PUBLICATIONS

TIPO Office Action dated Dec. 13, 2016, for corresponding Taiwanese Patent Application No. 102133414 (7 pages).

*Primary Examiner* — Keith Crawley
(74) *Attorney, Agent, or Firm* — Lewis Roca Rothgerber Christie LLP

(57) ABSTRACT

A touch key assembly includes a light guiding film between a window and a display panel, a flexible printed circuit (FPC) film attached to the light guiding film, and an attaching member including an attaching portion interposed between the light guiding film and the window, and a blocking portion interposed between the window and the display panel.

6 Claims, 4 Drawing Sheets

(56) References Cited

U.S. PATENT DOCUMENTS

| | | | |
|---|---|---|---|
| 2007/0046637 A1* | 3/2007 | Choo et al. | 345/169 |
| 2008/0068858 A1* | 3/2008 | Yamamoto et al. | 362/606 |
| 2011/0280037 A1* | 11/2011 | Cho et al. | 362/553 |
| 2012/0105340 A1 | 5/2012 | Beom et al. | |
| 2012/0169668 A1* | 7/2012 | Liu | G06F 1/1637 345/175 |
| 2012/0276957 A1* | 11/2012 | Yang et al. | 455/566 |
| 2012/0329526 A1* | 12/2012 | Song et al. | 455/566 |
| 2014/0028583 A1* | 1/2014 | Cho | 345/173 |

FOREIGN PATENT DOCUMENTS

| | | |
|---|---|---|
| KR | 10-2010-0085781 A | 7/2010 |
| KR | 10-2012-0044501 A | 5/2012 |

\* cited by examiner

TOUCH KEY ASSEMBLY AND DISPLAY DEVICE INCLUDING THE TOUCH KEY ASSEMBLY

CROSS-REFERENCE TO RELATED APPLICATION

This application claims priority under 35 USC §119 to and the benefit of Korean Patent Application No. 2013-0027092, filed on Mar. 14, 2013 in the Korean Intellectual Property Office (KIPO), the contents of which are herein incorporated by reference in its entirety.

BACKGROUND

1. Field

Example embodiments relate to a touch key assembly, a display device including the touch key assembly and a method of assembling the display device.

2. Description of the Related Art

An organic light emitting display (OLED) device may display desired information such as images, letters and/or characters using a light generated by combining holes provided from an anode with electrons provided from a cathode in an organic layer thereof. The OLED device may ensure a relatively wide viewing angle, rapid response speed, a small thickness, low power consumption, etc. Accordingly, the OLED device is expected to be one of the most widely used next-generation display devices.

The OLED device may include a display panel, a window and a touch key assembly. The touch key assembly may be attached to a non-display region of the window using a double-sided tape. In order to reduce (or prevent) light generated from the touch key assembly leaking through a display region of the window, a black ink may be coated on a portion of the touch key assembly oriented toward the display region. Further, in order to reduce a possibility of resin, which is located between the display panel and the window, infiltrating into the touch key assembly (or in order to prevent such infiltration by resin), a dam tape may be interposed between the display panel and the window.

A method of assembling the OLED device may include a process for coating the black ink, and a process for attaching the dam tape. Thus, the method may include complicated processes and may take a long time to complete. Particularly, a region of the touch key assembly where the black ink may be coated may result in restricting (or limiting) the size of the OLED device.

SUMMARY

Example embodiments provide a touch key assembly without a size limitation, that may be assembled by a few (or a reduced number of) processes.

Example embodiments also provide a display device including the above-mentioned touch key assembly.

Example embodiments still also provide a method of assembling the above-mentioned display device.

According to example embodiments, there may be provided a touch key assembly including a light guiding film between a window and a display panel, a flexible printed circuit (FPC) film attached to the light guiding film, and an attaching member including an attaching portion interposed between the light guiding film and the window, and a blocking portion interposed between the window and the display panel.

The attaching portion and the blocking portion may be integrally formed.

The blocking portion may have a black color for reducing leakage of light from the light guiding film.

The blocking portion may have a thickness greater than that of the attaching portion.

The attaching member may include a double-sided tape.

According to example embodiments, there may be provided a display device including a display panel, a window facing the display panel, the window having a display region and a non-display region, a touch key including a light guiding film between the non-display region of the window and the display panel, and a flexible printed circuit (FPC) film attached to the light guiding film; and an attaching member comprising an attaching portion interposed between the light guiding film and the window and a blocking portion interposed between the window and the display panel.

The blocking portion may be configured to isolate the touch key from a region where a resin configured to attach the display panel to the window is coated to reduce infiltration of the resin into the touch key.

The blocking portion may have a thickness substantially the same as a gap between the display panel and the window.

The display panel may include an organic light emitting display (OLED) panel.

According to example embodiments, there may be provided a method of assembling a display device including attaching an attaching member including an attaching portion and a blocking portion to a window, attaching a touch key to the attaching portion, and attaching a display panel to the blocking portion.

The method may further include attaching the display panel to the window using a resin, wherein the blocking portion is configured to block the resin to reduce infiltration of the resin into a touch key during attaching of the display panel to the window.

According to example embodiments, the attaching member may integrally include the attaching portion and the blocking portion so that the blocking portion may function to reduce (or prevent) the infiltration of the resin and to reduce (or prevent) the leakage of the light. Thus, a process for coating a black ink and a process for attaching a dam tap may be omitted so that the display device may be assembled by simple processes. Further, because it may not be required to prepare a region of the touch key where the black ink may be coated, a size of the display device may not be restricted (or limited). Furthermore, the blocking portion having a thick thickness may also function to mitigate the force of impacts applied to the display device.

BRIEF DESCRIPTION OF THE DRAWINGS

Example embodiments will be more clearly understood from the following detailed description taken in conjunction with the accompanying drawings.

FIG. 1 is a cross-sectional view illustrating a display device in accordance with example embodiments;

FIG. 2 is a perspective view illustrating the attaching member of the display device shown in FIG. 1;

FIG. 3 is an enlarged perspective view illustrating the portion III of the attaching member shown in FIG. 2; and FIGS. 4 to 6 are cross-sectional views illustrating a method of assembling the display device shown in FIG. 1.

DETAILED DESCRIPTION

Figure 1:
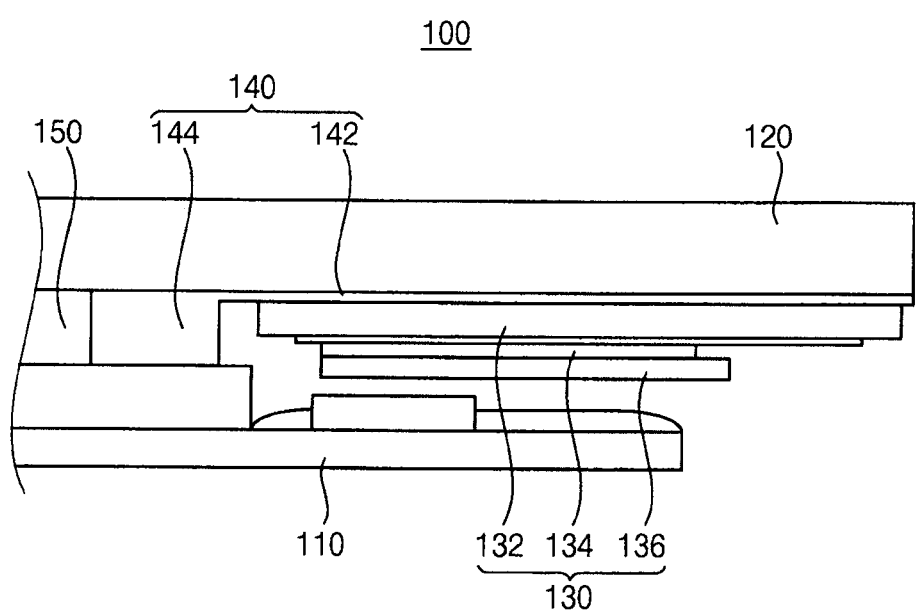
FIGS. 1 to 6 represent non-limiting embodiments, as described herein.

Various embodiments will be described more fully hereinafter with reference to the accompanying drawings, in which some embodiments are shown. The present invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another (or other) element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (for example, rotated 90 degrees or at other orientations) with the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, components, and/or groups but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Display Device

Figure 2:
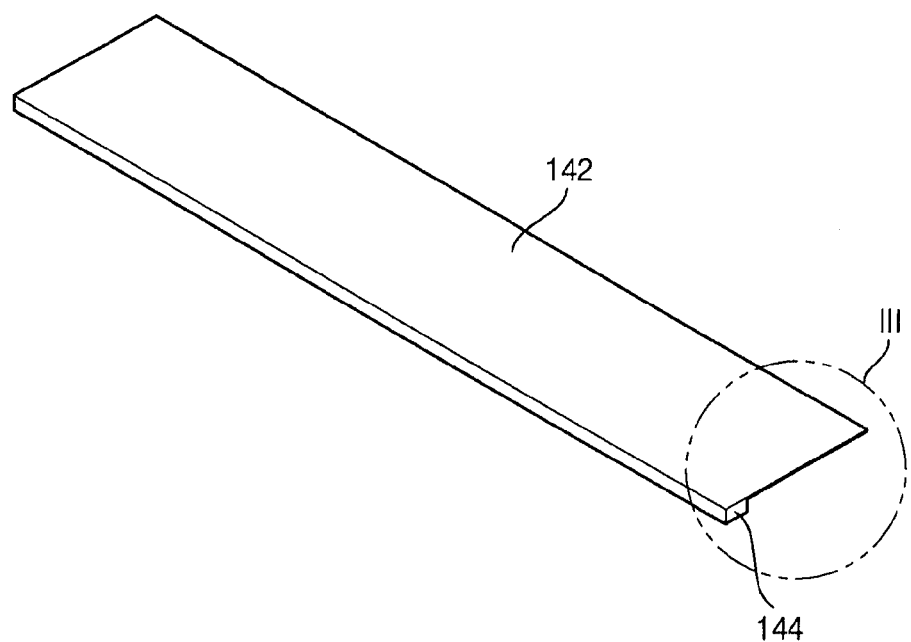
Figure 3:
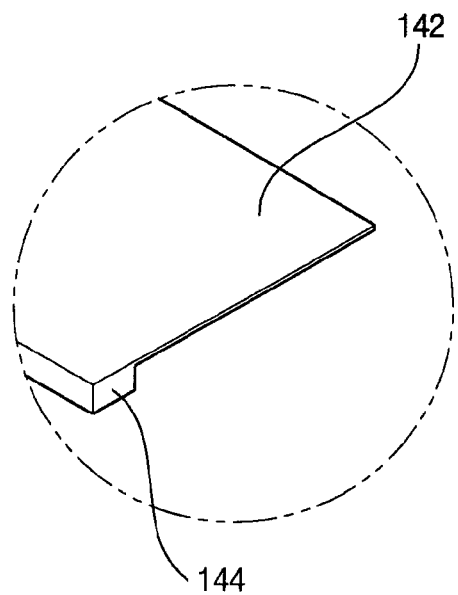

FIG. 1 is a cross-sectional view illustrating a display device in accordance with example embodiments, FIG. 2 is a perspective view illustrating an attaching member of the display device shown in FIG. 1, and FIG. 3 is an enlarged perspective view illustrating the portion III of the attaching member shown in FIG. 2.

Referring to FIGS. 1 to 3, a display device 100 of this example embodiment may include a display panel 110, a window 120, a touch key 130 and an attaching member 140.

In example embodiments, the display panel 110 may include a liquid crystal display (LCD) panel, a plasma display panel (PDP), an organic light emitting display (OLED) panel, an active matrix organic light emitting display (AMOLED) panel, etc.

The window 120 may be arranged over the display panel 110. The window 120 may have a display region and a non-display region. The window 120 may be attached to the display panel 110 using a resin 150 coated on the display region.

The touch key 130 may be arranged (or located) between the non-display region of the window 120 and the display panel 110. The touch key 130 may be attached to a lower surface of the non-display region of the window 120 oriented toward the display panel 110.

In example embodiments, the touch key 130 may include a light guiding film 132, a flexible printed circuit (FPC) film 134 and a base film 136. The FPC film 134 may be attached to an upper surface of the base film 136. The light guiding film 132 may be attached to an upper surface of the FPC film 134.

The attaching member 140 may be interposed between the touch key 130 and the window 120 to attach the touch key 130 to the window 120. In example embodiments, the attaching member 140 may include an attaching portion 142 and a blocking portion 144. The attaching member 140 may include a double-sided tape.

The attaching portion 142 may be interposed between the light guiding film 132 and the window 120. Thus, the touch key 130 may be fixed to the window 120 by attaching the light guiding film 132 to the window 120 using the attaching portion 142.

The blocking portion 144 may be interposed between the display panel 110 and the window 120. The display panel 110 and the window 120 may be mainly (or primarily) attached to each other by the resin 150. Further, the display panel 110 and the window 120 may be partially attached to each other by the blocking portion 144. Thus, the blocking portion 144 may have a lower surface configured to make contact with the display panel 110 and an upper surface configured to make contact with the window 120.

In example embodiments, the blocking portion 144 may be positioned (or located) between the display region and the non-display region of the window 120. Therefore, the blocking portion 144 may isolate (or separate) the display region and the non-display region from each other. That is, the resin 150 at the display region and the touch key 130 at the non-display region may be isolated (or separated) from each other. Thus, the blocking portion 144 may reduce (or prevent) infiltration of the resin 150 at the display region into the touch key 130. As a result, a process for attaching a dam tape, which may reduce (or prevent) the infiltration of the resin, may not be required.

Further, the blocking portion 144 may also reduce (or prevent) infiltration of a light generated from the light guiding film 132 into the display region. In order to effectively reduce (or prevent) the infiltration of the light, the blocking portion 144 may have a black color. Thus, a process for coating a black ink, which may reduce (or prevent) the leakage of the light, may not be required. Further, it may not be required to prepare a region of the touch key 130 where the black ink may be coated.

Furthermore, the blocking portion 144 may have a thickness substantially the same as an interval (or space) between the display region 110 and the window 120. Thus, the thickness of the blocking portion 144 may be thicker than that of the attaching portion 142. As mentioned above, the upper surface of the blocking portion 144 may be configured to closely make contact with the window 120 and the lower surface of the blocking portion 144 may be configured to closely make contact with the display panel 110. Because the thick blocking portion 144 may have elasticity, the blocking portion 144 may also mitigate the force of impacts applied to the display device 100.

In example embodiments, the blocking portion 144 may be integrally formed with the attaching portion 142. Thus, the blocking portion 144 may be attached to the window 120 together with the attaching portion 142 by attaching the attaching member 140 to the window 120, because the blocking portion 144 may not be separately formed from the attaching member 140. Therefore, as mentioned above, the process for attaching the dam tap may be omitted due to the presence of the blocking portion 144.

Method of Assembling a Display Device

Figure 4:
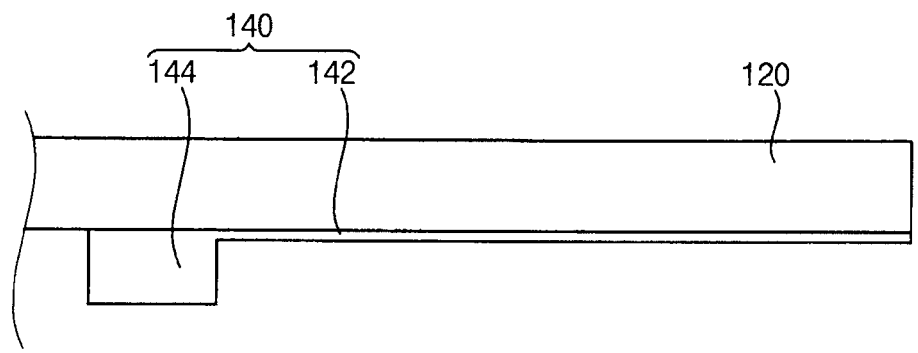
Figure 5:
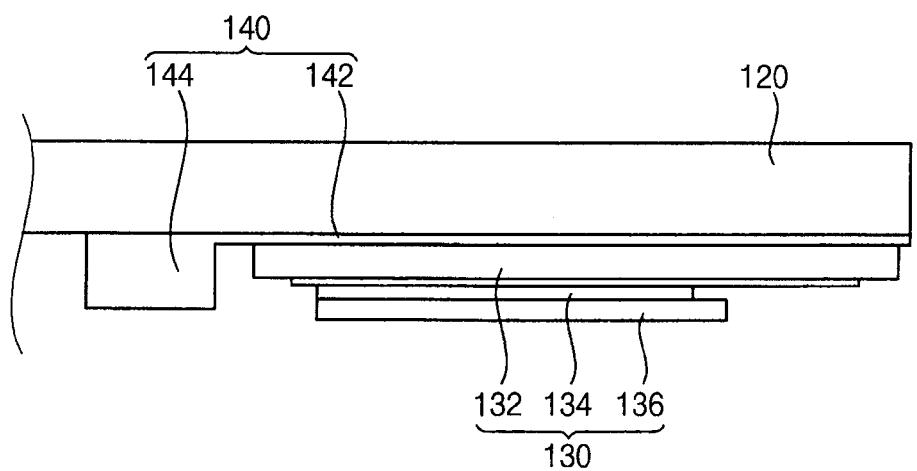
Figure 6:
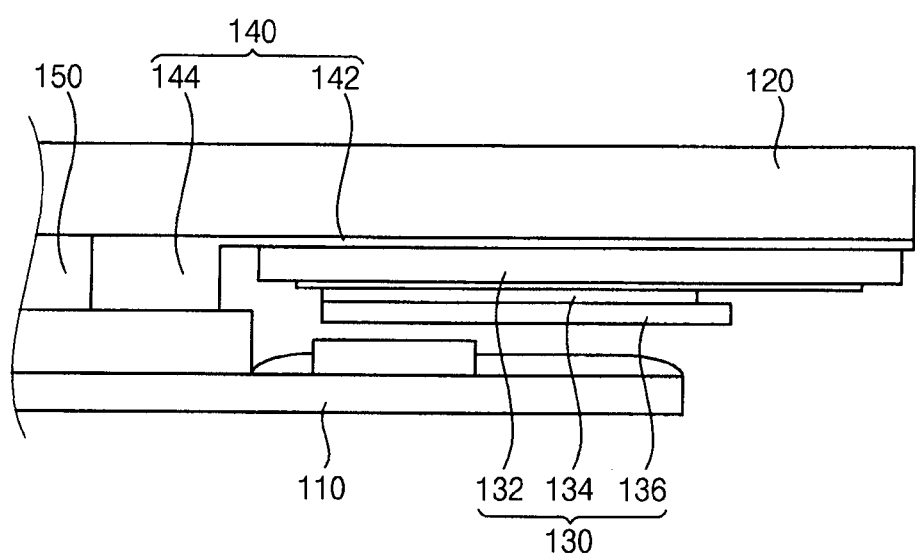

FIGS. 4 to 6 are cross-sectional views illustrating a method of assembling the display device shown in FIG. 1.

Referring to FIG. 4, the attaching member 140 may be attached to the non-display region of the window 120. In example embodiments, the attaching portion 142 may be attached to the non-display region of the window 120. The blocking portion 144 may be positioned (or located) between the display region and the non-display region of the window 120.

Referring to FIG. 5, the touch key 130 may be attached to the attaching portion 142. Thus, the touch key 130 may be positioned (or located) at the non-display region of the window 120. As a result, the touch key 130 may be isolated (or separated) from the display region of the window 120 by the blocking portion 144.

In example embodiments, because the blocking portion 144 may reduce (or prevent) the infiltration of the light generated from the light guiding film 132 into the display region of the window 120, the process of coating the black ink may not be required. Further, it may not be required to prepare the region of the touch key 130 where the black ink may be coated.

Referring to FIG. 6, the display panel 110 may be attached to the window 120 using the blocking portion 144. An edge portion of the display panel 110 may be attached to the window 120 using the blocking portion 144 so that the display panel 110 may be partially fixed to the window 120.

In example embodiments, the thickness of the blocking portion 144 may be substantially the same as the interval (or space) between the display panel 110 and the window 120 so that the blocking portion 144 may substantially (or completely) isolate (or separate) the display region and the non-display region of the window 120 from each other. As a result, the resin at the display region may be isolated (or separated) from the touch key 130 at the non-display region.

The resin 150 may be coated between the display region of the window 120 and the display panel 110 to firmly attach the window 120 and the display panel 110 to each other, thereby completing the display device 100 shown in FIG. 1.

In example embodiments, the blocking member 144 may isolate (or separate) the display region and the non-display region of the window 120 so that infiltration of the resin 150 into the non-display region of the window 120 is reduced (or prevented). Thus, the resin 150 may not infiltrate into the touch key 130 at the non-display region.

According to example embodiments, the attaching member may integrally include the attaching portion and the blocking portion so that the blocking portion may function to reduce (or prevent) the infiltration of the resin and function to reduce (or prevent) the leakage of the light. Thus, a process for coating a black ink and a process for attaching a dam tap may be omitted so that the display device may be assembled by simple processes. Further, because it may not be required to prepare a region of the touch key where the black ink may be coated, a size of the display device may not be restricted (or limited). Furthermore, the blocking portion having a thick thickness may also function to mitigate the force of impacts applied to the display device.

The foregoing is illustrative of embodiments and is not to be construed as limiting thereof. Although a few embodiments have been described, those skilled in the art will readily appreciate that many modifications are possible to the embodiments without materially departing from the novel teachings and aspects of the invention. Accordingly, all such modifications are intended to be included within the scope of the invention as defined in the claims. In the claims, means-plus-function clauses are intended to cover the structures described herein as performing the recited function and not only structural equivalents, but also equivalent structures. Therefore, it is to be understood that the foregoing is illustrative of various embodiments and is not to be construed as limited to the specific embodiments disclosed, and that modifications to the disclosed embodiments, as well as to other embodiments, are intended to be included within the scope of the appended claims, and equivalents thereof.

What is claimed is:

1. A touch key assembly comprising:
   a touch key comprising:
     a light guiding film between a window and a display panel; and
     a flexible printed circuit (FPC) film attached to the light guiding film;
   a resin fixing the window to the display panel; and
   an attaching member that is separate from the light guiding film, and that is a double-sided tape comprising:

an attaching portion interposed between the light guiding film and the window for attaching the light guiding film to the window; and a blocking portion integrally formed with the attaching portion, interposed between the window and the display panel for attaching the window to the display panel, interposed between the touch key and the resin for reducing infiltration of the resin into the touch key, and having a thickness that is greater than that of the attaching portion in a display direction for reducing leakage of light from the light guiding film.

2. The touch key assembly of claim 1, wherein the blocking portion has a black color.

3. A display device comprising:
a display panel;
a window facing the display panel, the window having a display region and a non-display region;
a resin attaching the display panel to the window;
a touch key comprising a light guiding film between the non-display region of the window and the display panel, and a flexible printed circuit (FPC) film attached to the light guiding film; and
an attaching member that is separate from the light guiding film, and that is a double-sided tape comprising an attaching portion interposed between the light guiding film and the window for attaching the light guiding film to the window; and a blocking portion integrally formed with the attaching portion, interposed between the window and the display panel for attaching the window to the display panel, interposed between the touch key and the resin for reducing infiltration of the resin into the touch key, and having a thickness that is greater than that of the attaching portion in a display direction for reducing infiltration of light from the light guiding film.

4. The display device of claim 3, wherein the blocking portion is configured to isolate the touch key from a region where a resin configured to attach the display panel to the window is coated.

5. The display device of claim 4, wherein the blocking portion has a thickness substantially the same as a gap between the display panel and the window.

6. The display device of claim 3, wherein the display panel comprises an organic light emitting display (OLED) panel.

* * * * *